(12) United States Patent
Kakuta

(10) Patent No.: US 7,319,350 B2
(45) Date of Patent: Jan. 15, 2008

(54) LOCK-DETECTION CIRCUIT AND PLL CIRCUIT USING SAME

(75) Inventor: Takeshi Kakuta, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 11/332,401

(22) Filed: Jan. 17, 2006

(65) Prior Publication Data

US 2006/0164138 A1    Jul. 27, 2006

(30) Foreign Application Priority Data

Jan. 24, 2005    (JP) ............................. 2005-016005

(51) Int. Cl.
*H03L 7/06* (2006.01)
(52) U.S. Cl. .......................................... 327/156; 327/5
(58) Field of Classification Search ................ None
See application file for complete search history.

(56) References Cited

U.S. PATENT DOCUMENTS 5,126,690 A * 6/1992 Bui et al. ................... 331/1 A
5,889,436 A * 3/1999 Yeung et al. ................... 331/2
6,466,058 B1 * 10/2002 Goldman ..................... 327/49
6,704,383 B2 * 3/2004 Lee et al. .................... 375/376

FOREIGN PATENT DOCUMENTS

JP    A-63-263919    10/1988
JP    A-4-337924    11/1992

* cited by examiner

*Primary Examiner*—Cassandra Cox
(74) *Attorney, Agent, or Firm*—Oliff & Berridge, PLC

(57) ABSTRACT

A lock-detection circuit that can set an acceptable phase-error range adapted to define a locked state and/or an unlocked state at a constant rate without being affected by a frequency and that can detect the locked state and/or the unlocked state with precision without being affected by various fluctuations and variations, and a PLL circuit including the lock-detection circuit. The range corresponding to a phase difference between first and second output signals is determined to be a locked-state range, where the phase of each of the first and second output signals delays or advances with reference to that of an oscillation-output signal transmitted from a voltage-controlled-oscillation circuit.

9 Claims, 6 Drawing Sheets

LOCK-DETECTION CIRCUIT AND PLL CIRCUIT USING SAME

BACKGROUND

The present invention relates to a lock-detection circuit and a phase-locked-loop (PLL) circuit, and particularly relates to a lock-detection circuit configured to detect the phase synchronization between a reference signal and an oscillation-output signal transmitted from a voltage-controlled-oscillation circuit, and a PLL circuit including the lock-detection circuit.

A known and typical PLL circuit 40 includes a phase-frequency-detection (PFD) circuit 41, a charge pump (CP) 42, a loop filter (LF) 43, and a voltage-controlled-oscillation (VCO) circuit 44, as shown in FIG. 6. A reference signal REFCLK is externally transmitted to the PLL circuit 40 and the phase-and-frequency difference between the reference signal REFCLK and an oscillation-output signal FBCLK transmitted from the voltage-controlled-oscillation circuit 44 is detected by the phase-frequency-detection circuit 41. The phase-frequency-detection circuit 41 transmits the up-pulse signal UP and down-pulse signal DOWN corresponding to the phase-and-frequency difference to the charge pump 42. Here, the charge pump 42 operates with a negative logic. Therefore, when the phase of the reference signal REFCLK synchronizes with that of the oscillation-output signal FBCLK, each of the up-pulse signal UP and the down-pulse signal DOWN remains in a "H" state, and an output signal CPOUT is not transmitted from the charge pump 42. If the phase of the oscillation-output signal FBCLK delays with reference to that of the reference signal RFCLK, an up-pulse signal UP having the "L" pulse width corresponding to the phase difference between the reference signal REFCLK and the oscillation-output signal FBCLK is externally transmitted. Here, the down-pulse signal DOWN remains in a "H" state. If the phase of the oscillation-output signal FBCLK advances with reference to that of the reference signal REFCLK, a down-pulse signal DOWN having the "L" pulse width corresponding to the phase difference between the reference signal REFCLK and the oscillation-output signal FBCLK is externally transmitted. Here, the up-pulse signal UP remains in a "H" state. The charge pump 42 electrically charges and/or discharges the loop filter 43 according to the "L" pulse width of up-pulse signal UP and the down-pulse signal DOWN that are transmitted from the phase-frequency-detection circuit 41. A control signal VCONT determined by electrical charges accumulated in the capacitor of the loop filter 43 is transmitted to the voltage-controlled-oscillation circuit 44 and the voltage-controlled-oscillation circuit 44 transmits an oscillation-output signal FBCLK with the frequency corresponding to the voltage of the control signal VCONT.

Thus, the phase-frequency difference between the reference signal REFCLK and the oscillation-output signal FBCLK transmitted from the voltage-controlled-oscillation circuit 44 is detected. Every time the phase-frequency difference is detected, the oscillation frequency of the oscillation-output signal FBCLK is changed according to the detected phase-frequency difference. Subsequently, the phase and frequency of the reference signal REFCLK are synchronized with those of the oscillation-output signal FBCLK. Hereinafter, the above-described synchronization is often referred to as "to lock", "locking", "being locked", etc.

Various circuits have been proposed, as lock-detection circuits configured to detect whether or not a reference signal and an oscillation-output signal transmitted from a voltage-controlled-oscillation circuit are locked to each other, so as to be used for a PLL circuit such as the above-described PLL circuit 40. For example, a known synchronization-detection circuit is shown in FIG. 5 of Japanese Unexamined Patent Application Publication No. 4-337924. Since the above-described known synchronization-detection circuit requires many analog circuits, the circuit often becomes too alert to the fluctuations and variations of its components. Therefore, it has been difficult to design the above-described known synchronization-detection circuit. For solving the above-described problems, Japanese Unexamined Patent Application Publication No. 4-337924 proposes a synchronization-detection circuit including a logic circuit and a latch circuit, as shown in FIG. 1 of the publication.

Further, Japanese Unexamined Patent Application Publication No. 63-263919 discloses a PLL circuit including a detection unit configured to generate a detection signal when the phase difference between a controlled signal and a reference signal falls within a predetermined range (an acceptable phase-error range) and an acceptable-phase-error-change unit configured to change the predetermined range.

In the synchronization-detection circuit proposed in Japanese Unexamined Patent Application Publication No. 4-337924, the absolute value of the acceptable phase-error range is set, as a steady value. Therefore, it is difficult for the synchronization-detection circuit to determine and detect a locked state and/or an unlocked state at a constant rate due to frequencies and various fluctuations and/or variations.

Further, even though various acceptable phase-error ranges can be set according to frequencies, as is the case with the PLL circuit disclosed in Japanese Unexamined Patent Application Publication No. 63-263919, it is often difficult to set an acceptable phase-error range with precision when there are various fluctuations and/or variations.

SUMMARY

Accordingly, various exemplary embodiments of the present invention provide a lock-detection circuit and a PLL circuit including the lock-detection circuit. The lock-detection circuit can set an acceptable phase-error range that determines the range corresponding to a locked state and an unlocked state at a constant rate with precision and without being affected by a frequency and various fluctuations and/or variations. Subsequently, the lock-detection circuit can detect the locked state and/or the unlocked state.

A lock-detection circuit according to an exemplary aspect of the present invention is configured to detect whether or not an oscillation-output signal transmitted from a voltage-controlled-oscillation circuit synchronizes with a reference signal. In the lock-detection circuit, it is detected that the reference signal falls within the range corresponding to a difference between a first phase of a first output signal and a second phase of a second output signal, where the first output signal advances by as much as a first predetermined phase amount with reference to the oscillation-output signal, and the second output signal delays by as much as a second predetermined phase amount with reference to the oscillation-output signal.

According to various exemplary embodiments, a PLL circuit includes at least one phase-frequency-detection circuit, at least one loop filter, and at least one voltage-controlled-oscillation circuit, and generates at least one oscillation-output signal that synchronizes with at least one reference signal. The PLL circuit may include at least one lock-detection circuit configured to detect the reference signal that falls within the range corresponding to a difference between a first phase of a first output signal and a second phase of a second output signal, where the first output signal advances by as much as a first predetermined phase amount with reference to the oscillation-output signal, and the second output signal delays by as much as a second predetermined phase amount with reference to the oscillation-output signal.

According to various exemplary embodiments, the voltage-controlled-oscillation circuit is provided as a ring-oscillation circuit including a plurality of inverters connected to one another in a ring shape, the first output signal is transmitted from a second inverter, provided ahead of a first inverter, that transmits the oscillation-output signal by as much as a first predetermined number of stages, and the second output signal is transmitted from a third inverter provided at the rear of the first inverter by as much as a second predetermined number of stages.

According to various exemplary embodiments, the lock-detection circuit includes a first phase-frequency-detection circuit configured to compare the first output signal with the reference signal, a second phase-frequency-detection circuit configured to compare the second output signal with the reference signal, a first latch circuit configured to latch a first comparison result obtained by the first phase-frequency-detection circuit, and a second latch circuit configured to latch a second comparison result obtained by the second phase-frequency-detection circuit.

Thus, the above-described lock-detection circuit and PLL circuit including the same determine the range corresponding to a phase difference between first and second output signals to be a locked-state range, where the phase of each of the first and second output signals delays or advances with reference to that of an oscillation-output signal transmitted from a voltage-controlled-oscillation circuit. If a reference signal falls within the phase-difference range, that is, the locked-state range, a locked state is detected. Otherwise, an unlocked state is detected. Subsequently, it becomes possible to set an acceptable phase-error range defining a range from the locked state to the unlocked state at a constant rate without being affected by frequencies and detect the locked state and/or the unlocked state with precision and without being affected by various fluctuations and variations.

DETAILED DESCRIPTION OF EMBODIMENTS

Hereinafter, a lock-detection circuit 20 and a PLL circuit 10 according to various exemplary embodiments of the present invention will be described in detail with reference to the attached drawings.

Figure 1:
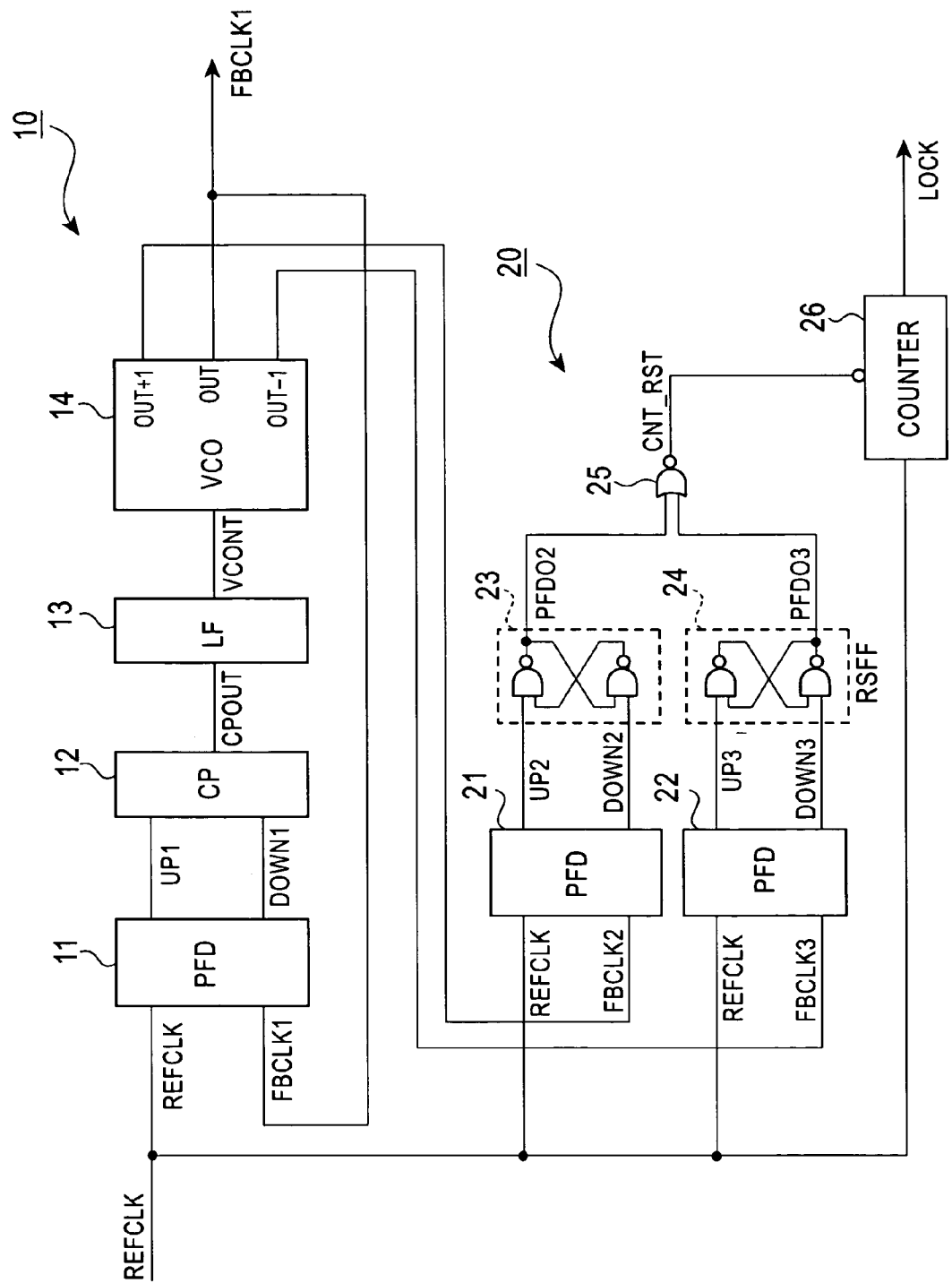
FIG. 1 is a schematic diagram illustrating the configurations of a lock-detection circuit and a PLL circuit including the lock-detection circuit according to an exemplary embodiment of the present invention.

FIG. 1 is a schematic diagram illustrating the configuration of the exemplary PLL circuit 10. The PLL circuit 10 shown in FIG. 1 is achieved by using the present invention for a conventional PLL circuit 40 shown in FIG. 6. Namely, the PLL circuit 10 has a lock-detection circuit 20 in addition to the elements shown in FIG. 6.

As shown in FIG. 1, the lock-detection circuit 20 may include two phase-frequency-detection circuits 21 and 22, two latch circuits (reset set flip-flop (RSFF) circuits) 23 and 24, and a counter (COUNTER) 26. Each of the two phase-frequency-detection circuits 21 and 22 may have the same configuration as that of a phase-frequency-detection circuit 11 provided in the known PLL circuit 10.

Figure 2:
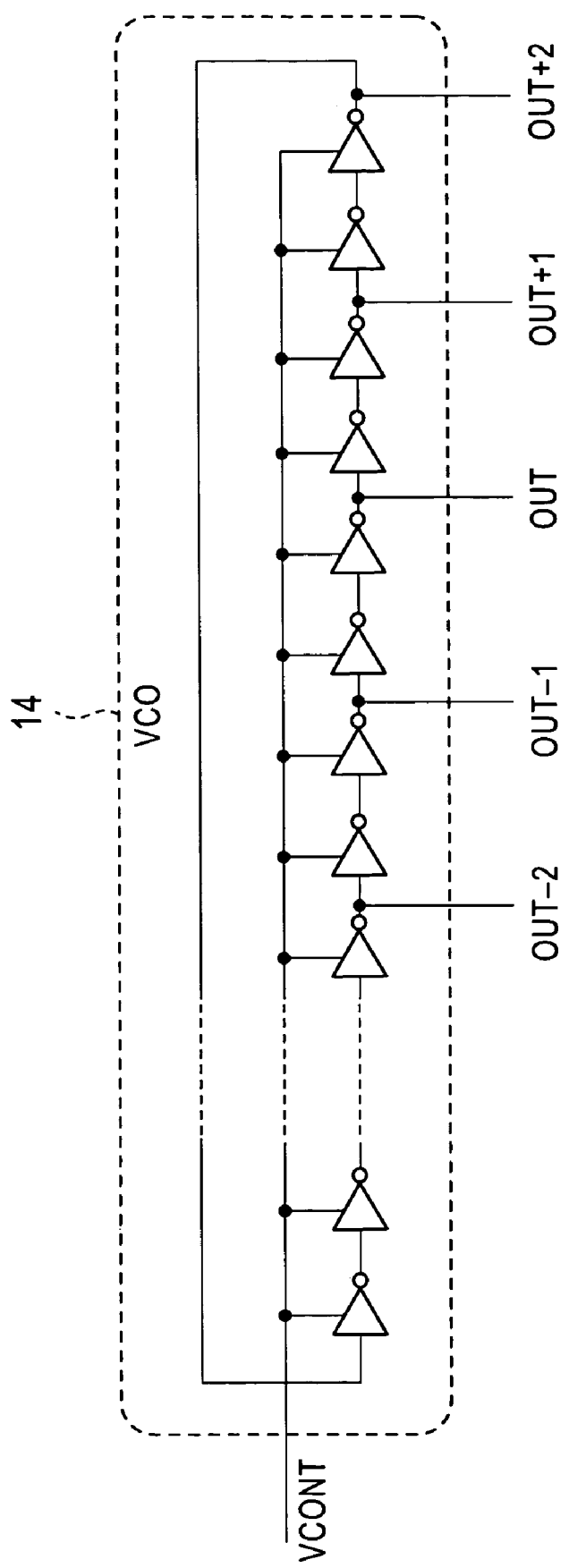
FIG. 2 is a schematic diagram illustrating the configuration of a voltage-controlled-oscillation circuit according to another exemplary embodiment of the present invention, where the voltage-controlled-oscillation circuit is provided in the PLL circuit, as shown in FIG. 1.

FIG. 2 is a schematic diagram illustrating the configuration of a voltage-controlled-oscillation circuit 14 according to another exemplary embodiment of the present invention, where the voltage-controlled-oscillation circuit 14 is provided in the PLL circuit 10. As shown in FIG. 2, the exemplary voltage-controlled-oscillation circuit 14 is a ring-oscillation circuit including an odd number of inverters connected to one another in a ring shape. An oscillation frequency of the ring-oscillation circuit is controlled by a control signal VCONT transmitted from a loop filter 13. Further, the ring-oscillation circuit, that is, the voltage-controlled-oscillation circuit 14 includes an output terminal OUT configured to transmit an oscillation-output signal FBCLK1, at least two output terminals OUT−1, OUT−2, and so forth that are configured to transmit an output signal (referred to as a first output signal) FBCLK2 that advances by as much as a predetermined phase amount with reference to the oscillation-output signal FBCLK1, and at least two output terminals OUT+1, OUT+2, and so forth that are configured to transmit an output signal (referred to as a second output signal) FBCLK3 that delays by as much as a predetermined phase amount with reference to the oscillation-output signal FBCLK1.

Figure 4:
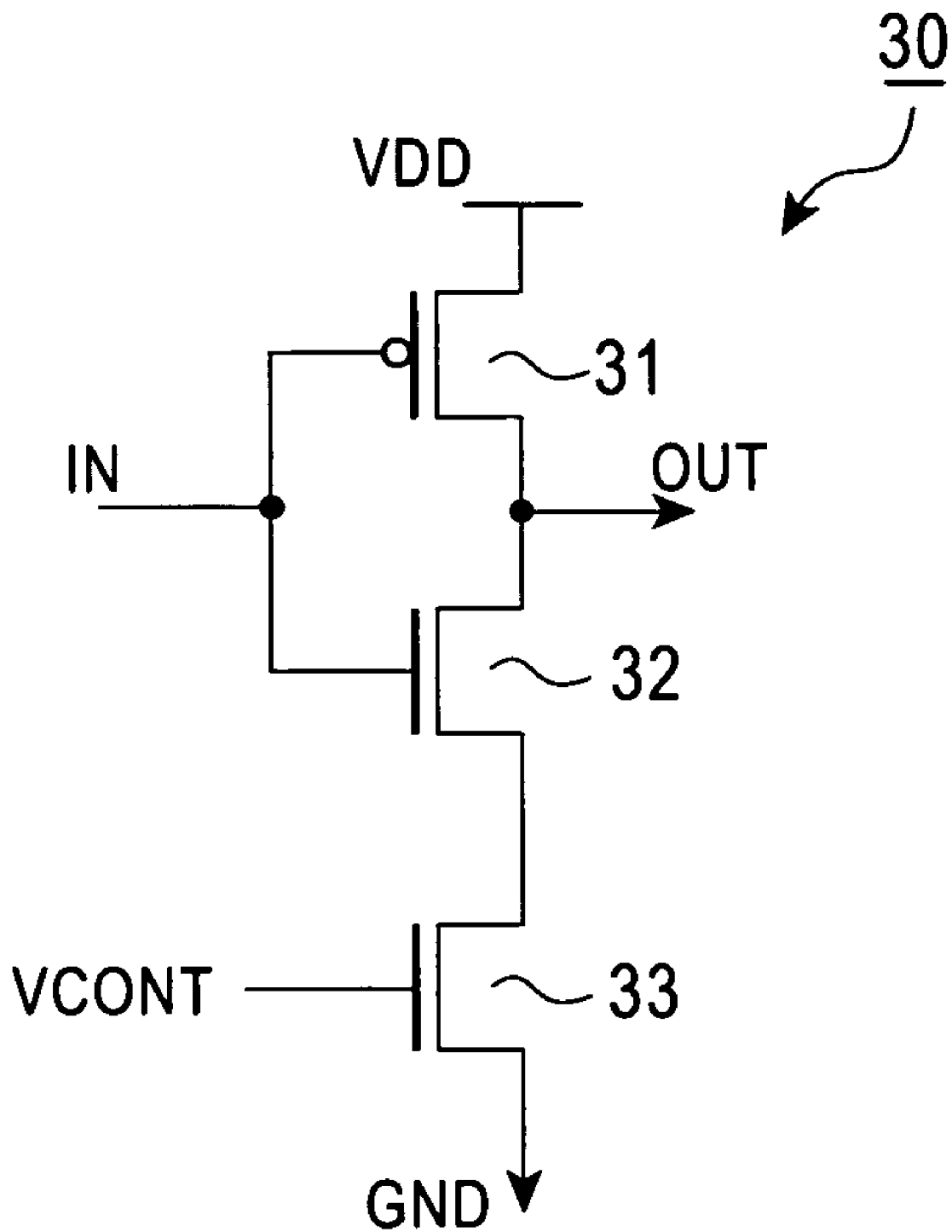
FIG. 4 is a schematic diagram showing an exemplary configuration of a single inverter according to another embodiment of the present invention of a plurality of inverters that forms a ring-oscillation circuit.

FIG. 4 is a schematic diagram showing an exemplary configuration of an inverter 30 of the inverters that form the exemplary voltage-controlled-oscillation circuit 14, that is, the ring-oscillation circuit. As shown in FIG. 4, the above-described exemplary inverter 30 includes a PMOS transistor 31 and two NMOS transistors 32 and 33 that are connected in series between a power voltage VDD and a ground GND. According to various exemplary embodiments, the drain of each of the PMOS transistor 31 and the NMOS transistor 32 is connected to an output terminal OUT of the inverter 30. Further, the gate of each of the PMOS transistor 31 and the NMOS transistor 32 may be connected to an input terminal IN of the inverter 30. According to various exemplary embodiments, an output signal transmitted from an inverter in the preceding stage is transmitted to the input terminal IN and an output signal transmitted from the output terminal OUT is transmitted to an inverter in the following stage. Further, the drain of the NMOS transistor 33 may be connected to the source of the NMOS transistor 32, and the source of the NMOS transistor 33 may be connected to the ground GND. Also, the control signal VCONT transmitted from the loop filter 13 may be transmitted to the gate of the NMOS transistor 33. Furthermore, the oscillation frequency of the voltage-controlled-oscillation circuit 14, that is, the ring-oscillation circuit including the above-described inverters, may be controlled by the control signal VCONT, as is described below.

According to various exemplary embodiments, a phase-frequency difference between a reference signal REFCLK and the oscillation-output signal FBCLK1 transmitted from the voltage-controlled-oscillation circuit 14 is first detected by the phase-frequency-detection circuit 11. The up-pulse signal UP1 and down-pulse signal DOWN1 corresponding to the phase-frequency difference may then be transmitted from the phase-frequency-detection circuit 11 to the charge pump 12. Also, the charge pump 12 may electrically charge and/or discharge the loop filter 13 according to the up-pulse signal UP1 and the down-pulse signal DOWN1 that are transmitted from the phase-frequency-detection circuit 11 so as to generate the control signal VCONT. Furthermore, the control signal VCONT may be transmitted to the gate of the NMOS transistor 33 of each of the inverters included in the ring-oscillation circuit so that the control signal VCONT controls a current flowing in the NMOS transistor 33 according to the voltage level of the control signal VCONT. Subsequently, the oscillation frequency of the ring-oscillation circuit may be adjusted.

Further, without being limited to the inverter shown in FIG. 4, the above-described inverter may include a logic circuit including a NAND circuit, a NOR circuit, and so forth, or a differential inverter. Thus, it is essential only that the inverter be configured to invert an input signal and control a current flowing therein by using the control signal VCONT.

Returning to FIGS. 1 and 2, operations of the above-described exemplary lock-detection circuit 20 are described below.

First, the output signals FBCLK1, FBCLK3, and FBCLK2 are transmitted from the output terminals OUT, OUT+1, and OUT−1 of the voltage-controlled-oscillation circuit 14, respectively. Here, the phase of the output signal FBCLK2 may advance by as much as a time period t12 with reference to that of the output signal FBCLK1. Further, the phase of the output signal FBCLK 3 may delay by as much as a time period t13 with reference to that of the output signal FBCLK1.

The output signal FBCLK1 may be transmitted to the phase-frequency-detection circuit 11 of the PLL circuit 10. Also, the output signal FBCLK2 and the reference signal REFCLK may be transmitted to the phase-frequency-detection circuit 21 so that the phase-frequency difference between the output signal FBCLK2 and the reference signal REFCLK is detected. Further, the output signal FBCLK3 and the reference signal REFCLK may be transmitted to the phase-frequency-detection circuit 22 so that the phase-frequency difference between the output signal FBCLK3 and the reference signal REFCLK is detected. When the output signals FBCLK2 and FBCLK3 are delayed with reference to the reference signal REFCLK, as described above, the up-pulse signals UP 2 and UP 3, having a "L" pulse width corresponding to the delay, are transmitted, even though the down-pulse signals DOWN 2 and DOWN 3 remain in a "H" state. Further, when the output signals FBCLK2 and FBCLK3 advances with reference to the reference signal REFCLK, the down-pulse signals DOWN2 and DOWN3 having "L" pulse width corresponding to the advance difference are transmitted, even though the up-pulse signals UP 2 and UP 3 remain in a "H" state.

Thus, according to the detection result, the up-pulse signals UP2 and the down-pulse signal DOWN2 that are transmitted from the phase-frequency-detection circuit 21 are latched by a latch circuit 23, and the up-pulse signal UP3 and the down-pulse signal DOWN3 that are transmitted from the phase-frequency-detection circuit 22 are latched by a latch circuit 24. An output signal PFDO2 transmitted from the latch circuit 23 and an output signal PFDO3 transmitted from the latch circuit 24 may be transmitted to a NOR circuit 25, and a reset signal CNT_RST used for resetting a counter may be transmitted from the NOR circuit 25. According to various exemplary embodiments, when the level of the reset signal CNT_RST is "L", the counter is reset. If the level of the reset signal CNT_RST is "H", the counter starts counting. A predetermined numerical value is set to the counter. If the counter reaches the predetermined numerical value, an output signal LOCK transmitted from the counter becomes the "H" level, for example.

Thus, in the above-described exemplary embodiment, when the PLL circuit is in a locked state, the counter is operated by using the reset signal CNT_RST and only when the counter counts by as much as a predetermined number, the locked state is detected.

Figure 3:
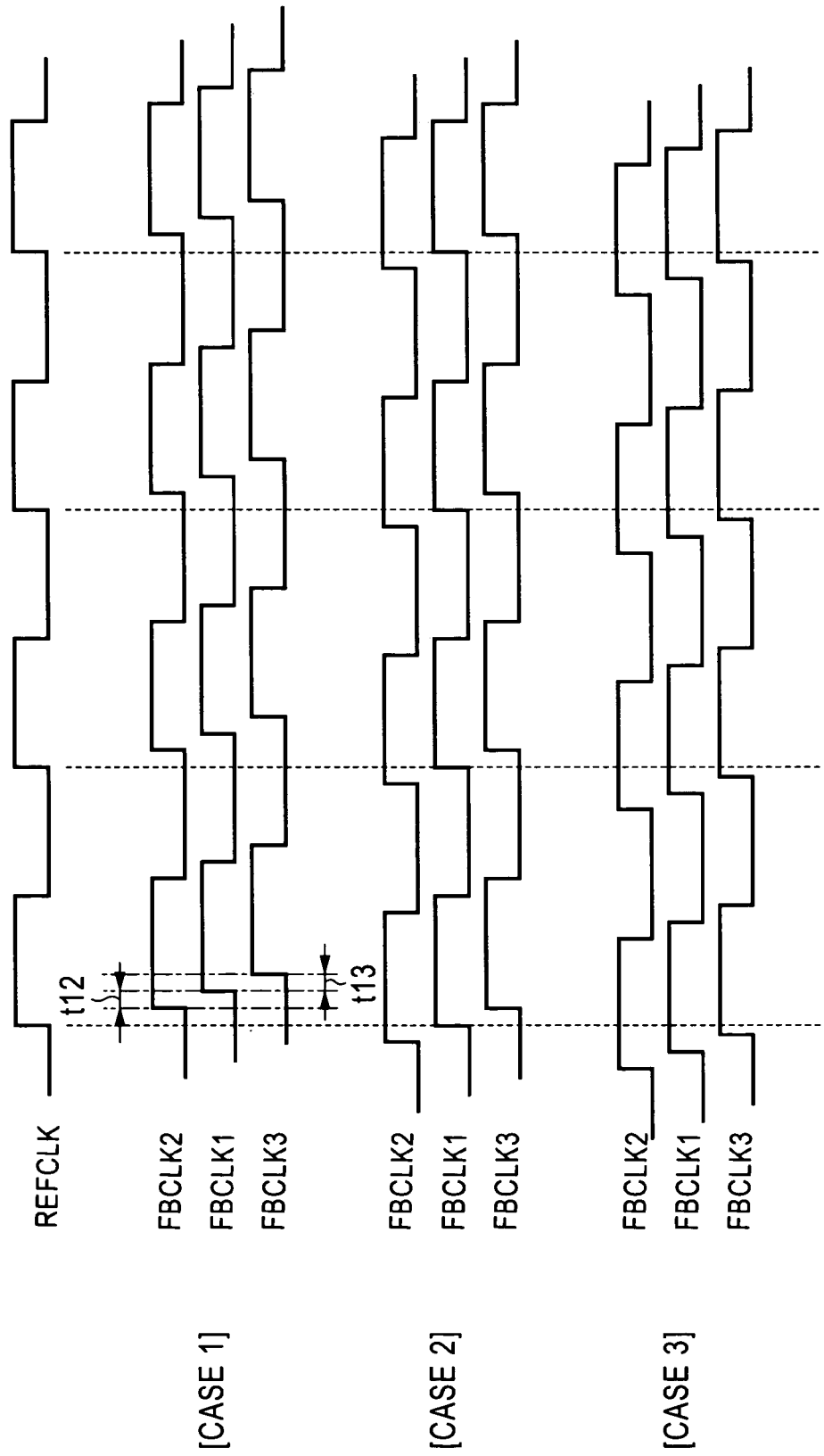
FIG. 3 is an exemplary timing diagram illustrating a locked state and an unlocked state of the lock-detection circuit.

FIG. 3 is a timing diagram showing the time where the lock-detection circuit 20 of the above-described exemplary embodiment detects the locked and/or unlocked state. As shown in FIG. 3, whether or not the PLL circuit is in the locked state or the unlocked state is determined according to the three following different phase relationships.

Case 1: When the phase of the oscillation-output signal FBCLK1 delays by as much as a time period longer than the time period t12 with reference to that of the reference signal REFCLK. (When the PLL circuit is in the unlocked state.)

Case 2: When the phase of the oscillation-output signal FBCLK1 delays by as much as the time period t12 or less, or advances by as much as a time period t13 or less with reference to that of the reference signal REFCLK. (When the PLL circuit is in the locked state.)

Case 3: When the phase of the oscillation-output signal FBCLK1 advances by as much as a time period longer than the time period t13 with reference to that of the reference signal REFCLK. (When the PLL circuit is in the unlocked state.)

Table 1 shows the relationship between the state of the up-pulse signal UP2 and the down-pulse signal DOWN2 that are transmitted to the latch circuit 23, the state of the up-pulse signal UP3 and the down-pulse signal DOWN3 that are transmitted to the latch circuit 24, and the state of the reset signal CNT_RST that is used for resetting the counter and that is transmitted from the NOR circuit 25 in each of exemplary Cases 1, 2, and 3. Further, in the example shown in Table 1, when the up-pulse signal UP1 is a "L" pulse signal (where the down-pulse signal DOWN1 remains in a "H" state), the charge pump 12 transmits a pulse signal CPOUT that is a "H" pulse signal. Subsequently, the voltage of the control signal VCONT increases, whereby an oscillation frequency of the voltage-controlled-oscillation circuit 14 increases. When the up-pulse signal UP1 remains in a "H" state (where the down-pulse signal DOWN1 is a "L" pulse signal), the charge pump 12 transmits the pulse signal CPOUT that is a "L" pulse signal. Subsequently, the voltage of the control signal VCONT decreases, whereby the oscillation frequency transmitted from the voltage-controlled-oscillation circuit 14 decreases.

|  | Case 1<br>(Unlocked State) | Case 2<br>(Locked State) | Case 3<br>(Unlocked State) |
| --- | --- | --- | --- |
| UP2 | "L" | "H" | "H" |
| DOWN2 | "H" | "L" | "L" |
| UP3 | "L" | "L" | "H" |
| DOWN3 | "H" | "H" | "L" |
| CNT_RST | "L" | "H" | "L" |

In Case 1, the phase of each of the output signals FBCLK2 and FBCLK3 that are transmitted from the voltage-controlled-oscillation circuit 14 of FIG. 1 delays with reference to that of the reference signal REFCLK. Therefore, the up-pulse signals UP2 and UP3, transmitted from the phase-frequency-detection circuits 21 and 22, are "L" pulse signals, and the down-pulse signals DOWN2 and DOWN3 remain in a "H" state, as shown in Table 1. Here, the output signal PFDO2 transmitted from the latch circuit 23 becomes "H" and the output signal PFDO3 transmitted from the latch circuit 24 becomes "L". Upon receiving the two output signals PFDO2 and PFDO3, the NOR circuit 25 transmits the output signal CNT_RST that is in a "L" state so that the counter is reset. That is to say, in that case, the PLL circuit 10 is in the unlocked state, a lock-detection signal LOCK transmitted from the counter becomes "L", and the locked state is not detected.

In Case 2, the phase of the output signal FBCLK2 transmitted from the voltage-controlled-oscillation circuit 14 of FIG. 1 advances with reference to that of the reference signal REFCLK and the phase of the output signal FBCLK3 delays with reference to that of the reference signal REFCLK. Therefore, the up-pulse signal UP2 transmitted from the phase-frequency-detection circuits 21 remains in a "H" state and the up-pulse signal UP3 transmitted from the phase-frequency-detection circuits 22 becomes a "L" pulse signal. Further, the down-pulse signal DOWN2 becomes a "L" pulse signal and the down-pulse signal DOWN3 remains in a "H" state. Here, the output signal PFDO2 transmitted from the latch circuit 23 and the output signal PFDO3 transmitted from the latch circuit 24 become "L", and the output signal CNT_RST transmitted from the NOR circuit 25 becomes "H" so that the counter operates. When the counter counts by as much as a predetermined number, the lock-detection signal LOCK transmitted from the counter becomes "H", and the locked state is detected.

In Case 3, the phase of each of the output signals FBCLK2 and FBCLK3 that are transmitted from the voltage-controlled-oscillation circuit 14 of FIG. 1 advances with reference to that of the reference signal REFCLK. Therefore, the up-pulse signals UP2 and UP3 transmitted from the phase-frequency-detection circuits 21 and 22 remain in the "H" state, and the down-pulse signals DOWN2 and DOWN3 are transmitted, as "L" pulse signals, as shown in Table 1. Here, the output signal PFDO2 transmitted from the latch circuit 23 becomes "L" and the output signal PFDO3 transmitted from the latch circuit 24 becomes "H". Further, the output signal CNT_RST transmitted from the NOR circuit 25 becomes "L", and the counter is reset. That is to say, the PLL circuit 10 is in the unlocked state, the lock-detection signal LOCK transmitted from the counter becomes "L", and the locked state is not detected.

As has already been described above, when the phase difference between the oscillation-output signal FBCLK1 and the reference signal REFCLK is the advance corresponding to the time period t12 or less, or the delay corresponding to the time period t13 or less, the locked state is detected so that the lock-detection circuit 20 transmits an "H" level signal as the lock-detection signal LOCK.

Further, in the lock-detection circuit 20 of the above-described embodiment shown in FIG. 1, the reset signal CNT_RST is generated by the latch circuits 23 and 24, and the NOR circuit 25. However, the reset signal CNT_RST may be generated by a 2-input AND circuit (not shown) to which the up-pulse signal UP2 and the down-pulse signal DOWN3 are transmitted. If the PLL circuit 10 is in the unlocked state, as in Case 1 and/or Case 3, either the up-pulse signal UP2 or the down-pulse signal DOWN3 becomes a "L" pulse signal. Subsequently, the output signal CNT_RST that is an AND between the up-pulse signal UP2 and the down-pulse signal DOWN3 becomes "L", the counter is reset, and the locked state is not detected. According to the above-described exemplary configuration, the PLL circuit 10 can be reduced in size.

As has been described in the above-described exemplary embodiment, an output signal is transmitted from each of the inverters of the voltage-controlled-oscillation circuit 14, that is, the ring-oscillation circuit, and the range of the above-described phase difference, that is, an acceptable phase-error range is set by using the output signals FBCLK2 and FBCLK3, where the phase of each of the output signals FBCLK2 and FBCLK3 delays or advances with reference to that of the oscillation-output signal FBCLK1.

According to various exemplary embodiments, the above-described acceptable phase-error range changes in accordance with an operation frequency of the ring-oscillation circuit. Therefore, even though the frequency of the reference signal REFCLK changes, the locked state can be detected at a constant rate for the frequency.

For example, the assumption is made that the voltage-controlled-oscillation circuit 14 of FIG. 1 operates over the frequency range from 10 to 100 MHz. Here, the number of inverters provided in the ring-oscillation circuit is determined to be one hundred. An output signal is transmitted from the output terminal OUT−1 provided at the rear of the output terminal OUT, as the output signal FBCLK2 transmitted from the voltage-controlled-oscillation circuit 14, and another output signal is transmitted from the output terminal OUT+1 provided ahead of the output terminal OUT, as the output signal FBCLK3 transmitted from the voltage-controlled-oscillation circuit 14, as shown in FIG. 2.

When the operation frequency is 10 MHz, the periodicity thereof becomes 100 ns. Therefore, the phase difference between the output terminal OUT and the output terminal OUT−1 and that between the output terminal OUT and the output terminal OUT+1 becomes 1 ns. Further, when the operation frequency is 100 MHz, the periodicity thereof becomes 10 ns and the above-described phase differences becomes 0.1 ns. In either case, it thus becomes possible to set an acceptable phase-error range corresponding to 1% of the periodicity, and to detect the locked state and/or the unlocked state at the same rate, even though the operation frequency changes.

Figure 6:
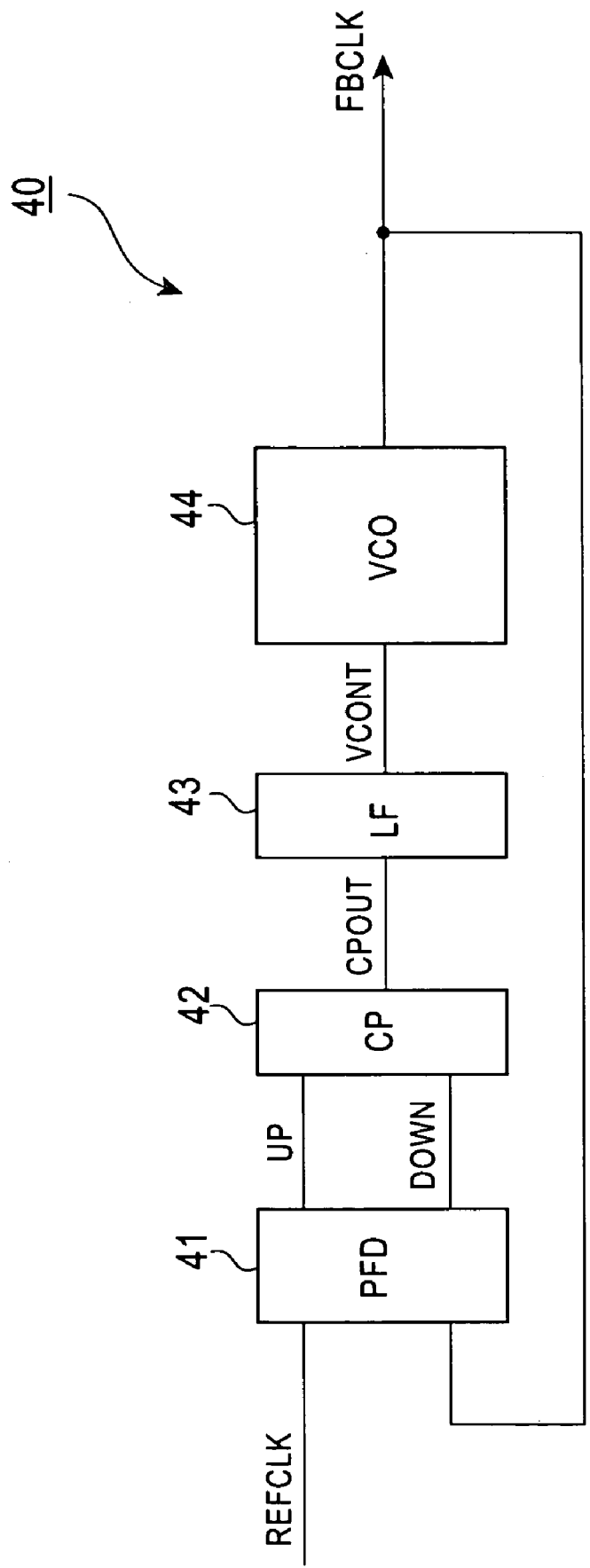
FIG. 6 is a schematic diagram of a conventional PLL circuit.

According to the above-described conventional technology illustrated in FIG. 6, however, a delay circuit with a fixed phase-error range is used. Therefore, even though the operation frequency of the delay circuit changes, the delay amount thereof remains constant. Therefore, only a constant phase difference is detected. For example, if the acceptable phase-error range is set to 0.5 ns and the operation frequency is 100 MHz, the locked state is detected before the PLL circuit 10 enters the locked state. Further, if the operation frequency is 10 MHz, the unlocked state is detected even though the PLL circuit 10 is in the locked state.

Further, if a user wants to change the acceptable phase-error range in the above-described embodiment, the output terminal of the inverters of the ring-oscillation circuit shown in FIG. 2 may be changed to the output terminal OUT+2 or the like, or the output terminal OUT−2 or the like, for example. Further, if the user wants to set different threshold values for the phase-advance direction and the phase-delay direction (set values of the acceptable phase-error range), the user can arrange the settings so that an output signal is transmitted from a different output terminal, such as the output terminal OUT+2 or the like, or the output terminal OUT−1 or the like.

Figure 5:
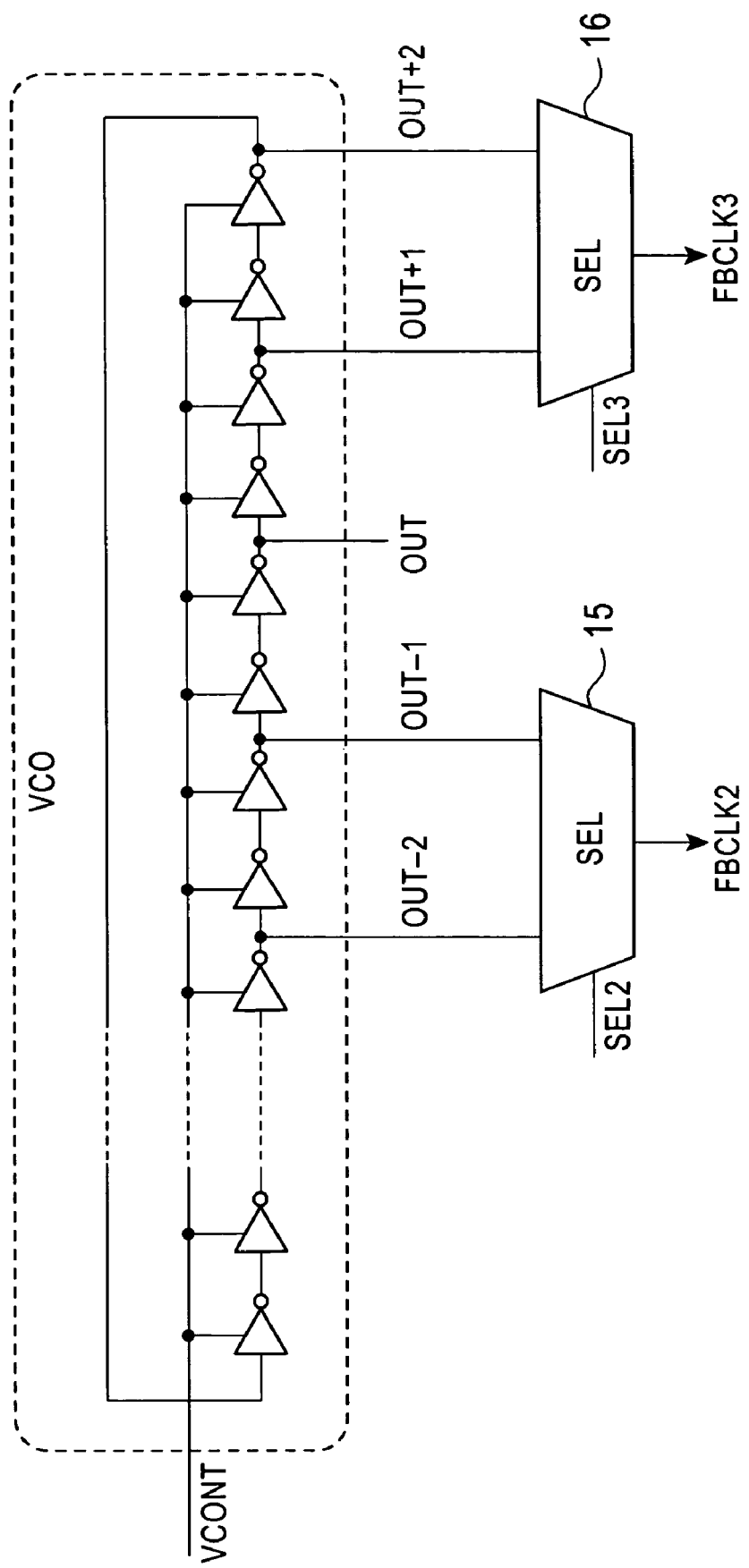
FIG. 5 is a schematic diagram illustrating the configuration of a voltage-controlled-oscillation circuit according to another exemplary embodiment of the present invention.

Thus, the output terminal from which the output signal is transmitted can be selected by using selectors (SEL) 15 and 16, for example, as shown in FIG. 5. Further, the selectors 15 and 16 may be directly controlled by an external signal. Otherwise, a resistor or the like may be provided in each of the selectors 15 and 16, so as to be set before the PLL circuit 10 starts operating.

Further, the above-described exemplary lock-detection circuit 20 can be used not only for the PLL circuit 10 of the above-described exemplary embodiment, but can also be used for a device configured to make a comparison between the phase of an oscillation-output signal transmitted from the above-described voltage-controlled-oscillation circuit 14 and that of a reference signal, for example, and synchronize the phase of the oscillation-output signal and that of the reference signal. The above-described device may be a clock-data-recovery (CDR) circuit or the like.

As has been described in the above-described embodiments of the present invention, the acceptable phase-error range for the lock detection is set by using the output signals transmitted from the plurality of inverters forming the ring-oscillation circuit included in the voltage-controlled-oscillation circuit 14. Subsequently, it becomes possible to set the acceptable phase-error range with precision without being affected by the manufacturing process, the used voltage, the ambient temperature. Further, there is no need to allow for a margin for various fluctuations and/or variations.

Also, when the operation frequency is changed dynamically, the acceptable phase-error range can be set at a constant rate for the operation frequency.

Moreover, according to the above-described exemplary embodiments of the present invention, it becomes possible to expand the acceptable phase-error range and increase the speed of detecting the locked state for an application wherein the speed of detecting the locked state is more important than the locking precision. Further, for an application that requires a predetermined degree of locking precision, it becomes possible to narrow the acceptable phase-error range so that the PLL circuit 10 enters the locked state to a sufficient degree and detect the locked state.

Thus, the exemplary lock-detection circuit 20 and the exemplary PLL circuit 10 including the lock-detection circuit 20 according to the exemplary embodiments of the present invention have been described in detail. However, the present invention is not limited to the above-described exemplary embodiments, but can be improved and/or modified in various ways without departing from the spirit and scope of the invention.

What is claimed is:

1. A lock-detection circuit configured to detect whether or not an oscillation-output signal synchronizes with a reference signal, comprising:

a voltage controlled-oscillation circuit that transmits the oscillation-output signal; and a phase detection circuit that detects a phase difference between the reference signal and the oscillation-output signal;

wherein the phase detection circuit detects whether the reference signal falls within the range corresponding to a difference between a first phase of a first output signal and a second phase of a second output signal, where the first output signal advances by as much as a first predetermined phase amount with reference to the oscillation-output signal and the second output signal delays by as much as a second predetermined phase amount with reference to the oscillation-output signal, wherein the voltage-controlled-oscillation circuit is provided as a ring-oscillation circuit including a plurality of inverters connected to one another in a ring shape, wherein the first output signal is transmitted from a second inverter provided ahead of a first inverter that transmits the oscillation-output signal by as much as a first predetermined number of stages, and the second output signal is transmitted from a third inverter provided at the rear of the first inverter by as much as a second predetermined number of stages.

2. The lock-detection circuit according to claim 1, wherein the voltage-controlled-oscillation circuit includes:

a first selector configured to select a first output terminal from among at least two output terminals of a plurality of inverters provided ahead of the first inverter and output the first output signal; and a second selector configured to select a second output terminal from among at least two output terminals of a plurality of inverters provided at the rear of the first inverter and output the second output signal.

3. The lock-detection circuit according to claim 2, the phase detection circuit comprising:

a first phase-frequency-detection circuit configured to compare the first output signal with the reference signal;

a second phase-frequency-detection circuit configured to compare the second output signal with the reference signal;

a first latch circuit configured to latch a first comparison result obtained by the first phase-frequency-detection circuit; and a second latch circuit configured to latch a second comparison result obtained by the second phase-frequency-detection circuit.

4. The lock-detection circuit according to claim 1, the phase detection circuit comprising:

a first phase-frequency-detection circuit configured to compare the first output signal with the reference signal;

a second phase-frequency-detection circuit configured to compare the second output signal with the reference signal;

a first latch circuit configured to latch a first comparison result obtained by the first phase-frequency-detection circuit; and a second latch circuit configured to latch a second comparison result obtained by the second phase-frequency-detection circuit.

5. A lock-detection circuit configured to detect whether or not an oscillation-output signal synchronizes with a reference signal, comprising:

a voltage controlled-oscillation circuit that transmits the oscillation-output signal; and a phase detection circuit that detects a phase difference between the reference signal and the oscillation-output signal;

wherein the phase detection circuit detects whether the reference signal falls within the range corresponding to a difference between a first phase of a first output signal and a second phase of a second output signal, where the first output signal advances by as much as a first predetermined phase amount with reference to the oscillation-output signal and the second output signal delays by as much as a second predetermined phase amount with reference to the oscillation-output signal, the phase detection circuit comprising:

a first phase-frequency-detection circuit configured to compare the first output signal with the reference signal;

a second phase-frequency-detection circuit configured to compare the second output signal with the reference signal;

a first latch circuit configured to latch a first comparison result obtained by the first phase-frequency-detection circuit; and a second latch circuit configured to latch a second comparison result obtained by the second phase-frequency-detection circuit.

6. A PLL circuit that includes at least one phase-frequency-detection circuit, at least one loop filter, and at least one voltage-controlled-oscillation circuit and that generates at least one oscillation-output signal that synchronizes with at least one reference signal, the PLL circuit comprising:

at least one lock-detection circuit configured to detect that the reference signal falls within the range corresponding to a difference between a first phase of a first output signal and a second phase of a second output signal, wherein the first output signal advances by as much as a first predetermined phase amount with reference to the oscillation-output signal and the second output signal delays by as much as a second predetermined phase amount with reference to the oscillation-output signal, the voltage-controlled-oscillation circuit includes a ring-oscillation circuit having a plurality of inverters connected to one another in a ring shape, wherein the first output signal is transmitted from a second inverter provided ahead of a first inverter that transmits the oscillation-output signal by as much as a first predetermined number of stages, and the second output signal is transmitted from a third inverter provided at the rear of the first inverter by as much as a second predetermined number of stages.

7. The PLL circuit according to claim 6, the voltage-controlled-oscillation circuit includes:

a first selector configured to select a first output terminal from among at least two output terminals of a plurality of inverters provided ahead of the first inverter and output the first output signal; and a second selector configured to select a second output terminal from among at least two output terminals of a plurality of inverters provided at the rear of the first inverter and output the second output signal.

8. The PLL circuit according to claim 6, the lock-detection circuit includes:

a first phase-frequency-detection circuit configured to compare the first output signal with the reference signal;

a second phase-frequency-detection circuit configured to compare the second output signal with the reference signal;

a first latch circuit configured to latch a first comparison result obtained by the first phase-frequency-detection circuit; and a second latch circuit configured to latch a second comparison result obtained by the second phase-frequency-detection circuit.

9. A PLL circuit that includes at least one phase-frequency-detection circuit, at least one loop filter, and at least one voltage-controlled-oscillation circuit and that generates at least one oscillation-output signal that synchronizes with at least one reference signal, the PLL circuit comprising:

at least one lock-detection circuit configured to detect that the reference signal falls within the range corresponding to a difference between a first phase of a first output signal and a second phase of a second output signal, wherein the first output signal advances by as much as a first predetermined phase amount with reference to the oscillation-output signal and the second output signal delays by as much as a second predetermined phase amount with reference to the oscillation-output signal, the lock-detection circuit includes:

a first phase-frequency-detection circuit configured to compare the first output signal with the reference signal;

a second phase-frequency-detection circuit configured to compare the second output signal with the reference signal;

a first latch circuit configured to latch a first comparison result obtained by the first phase-frequency-detection circuit; and a second latch circuit configured to latch a second comparison result obtained by the second phase-frequency-detection circuit.

* * * * *